US007045270B2

(12) United States Patent
Miyake et al.

(10) Patent No.: US 7,045,270 B2
(45) Date of Patent: May 16, 2006

(54) LITHOGRAPHIC PRINTING PLATE PRECURSOR AND PRODUCTION METHOD OF LITHOGRAPHIC PRINTING PLATE

(75) Inventors: Hideo Miyake, Shizuoka (JP); Akio Oda, Shizuoka (JP); Tomoyoshi Mitsumoto, Shizuoka (JP)

(73) Assignee: Fuji Photo Film Co. Ltd., Kanagawa (JP)

( * ) Notice: Subject to any disclaimer, the term of this patent is extended or adjusted under 35 U.S.C. 154(b) by 321 days.

(21) Appl. No.: 10/173,820

(22) Filed: Jun. 19, 2002

(65) Prior Publication Data

US 2003/0108814 A1 Jun. 12, 2003

(30) Foreign Application Priority Data

Jun. 20, 2001 (JP) .................................... P. 2001-186625

(51) Int. Cl.

| | |
|---|---|
| ***G03F 7/095*** | (2006.01) |
| ***G03F 7/11*** | (2006.01) |
| ***B41C 1/055*** | (2006.01) |
| ***B41C 1/501*** | (2006.01) |

(52) U.S. Cl. .................... 430/271.1; 430/156; 430/160; 430/162; 430/944

(58) Field of Classification Search ............. 430/271.1, 430/156, 160, 162

See application file for complete search history.

(56) References Cited

U.S. PATENT DOCUMENTS

| | | | | | |
|---|---|---|---|---|---|
| 5,837,425 | A | * | 11/1998 | Nakanishi et al. .......... | 430/331 |
| 6,841,330 | B1 | * | 1/2005 | Miyake et al. ........... | 430/270.1 |
| 2002/0136979 | A1 | * | 9/2002 | Miyake et al. .............. | 430/156 |
| 2003/0157434 | A1 | * | 8/2003 | Oda et al. ................ | 430/273.1 |

FOREIGN PATENT DOCUMENTS

| | | | | |
|---|---|---|---|---|
| EP | 0 851 296 | A1 | | 7/1998 |
| EP | 0 864 420 | A1 | | 9/1998 |
| EP | 1 072 432 | A2 | * | 1/2001 |
| EP | 1 211 065 | A2 | * | 6/2002 |
| WO | WO 99/67097 | | | 12/1999 |
| WO | WO 00/29214 | A1 | * | 5/2000 |

OTHER PUBLICATIONS

European Communication and Search Report dated Aug. 16, 2004.

* cited by examiner

*Primary Examiner*—Cynthia Hamilton
(74) *Attorney, Agent, or Firm*—Sughrue Mion, PLLC

(57) ABSTRACT

A lithographic printing plate precursor comprising a hydrophilic support, an alkali-soluble layer and provided on the alkali-soluble layer a recording layer which contains an infrared ray absorbent, an alkali-soluble resin and an inhibitor of inhibiting the alkali-soluble resin from dissolving in an alkali aqueous developer and increases in the solubility in an alkaline aqueous solution upon irradiation of infrared light, and a developing method of the lithographic printing plate precursor with a non-silicate developer.

2 Claims, No Drawings

LITHOGRAPHIC PRINTING PLATE PRECURSOR AND PRODUCTION METHOD OF LITHOGRAPHIC PRINTING PLATE

FIELD OF THE INVENTION

The present invention relates to a lithographic printing plate precursor and a production method of a lithographic printing plate. More specifically, the present invention relates to a positive working lithographic printing plate precursor for use in so-called direct plate-making capable of producing a printing plate directly from digital signals of a computer or the like with an infrared laser, and a method for producing a lithographic printing plate from the printing plate precursor. In particular, the present invention relates to a lithographic printing plate precursor excellent in both the scratch resistance and the sensitivity, and a method for producing a lithographic printing plate from the printing plate precursor.

BACKGROUND OF THE INVENTION

With remarkable progress of lasers in recent years, a high output and compact solid laser or semiconductor laser having a light emission region in the range from near infrared to infrared becomes easily available. These lasers are very useful as a light source for exposure in producing a printing plate directly from digital data of a computer or the like.

The positive working lithographic printing plate material for use with an infrared laser contains, as essential components, an alkali aqueous solution-soluble binder resin and an IR dye or the like capable of absorbing light to generate heat, where the exposed area (non-image area) dissolves in an alkali developer to form a lithographic printing plate.

However, such a positive working lithographic printing plate material for use with an infrared laser has a problem in that a sufficiently large difference is not attained between the dissolution resistance of the unexposed area (image area) against developer and the solubility of the exposed area (non-image area) under various use conditions, therefore, the sensitivity is low and over development or development failure is liable to occur due to the change of use conditions. Furthermore, the surface state readily fluctuates, for example, fine scratches are generated even by the touching with the surface at the handling, and such fine scratch or slight change on the surface causes increase of the solubility, as a result, the unexposed area (image area) dissolves at the development to leave scratch trace and this gives rise to the deterioration of impression capability or inking failure.

SUMMARY OF THE INVENTION

An object of the present invention is to overcome the problems of conventional techniques and provide a positive working lithographic printing plate precursor excellent in both the scratch resistance and the sensitivity, which is used with an infrared laser particularly in so-called direct plate-making capable of directly producing a printing plate based on digital signals of a computer or the like.

Another object of the present invention is to provide a method for producing a lithographic printing plate.

As a result of extensive investigations, the present inventors have found that when the recording layer is constructed by a multilayer structure, the upper layer of the multilayer structure contains an infrared absorbent, an alkali-soluble resin and an inhibitor of inhibiting the resin from dissolving in an alkali aqueous developer, and the development is performed with an alkali developer not containing a silicate and mainly comprising a base and an organic compound having a buffering activity, both high scratch resistance and high sensitivity can be attained. The present invention has been accomplished based on this finding.

More specifically, the present invention includes the following items.

(1) A lithographic printing plate precursor comprising a hydrophilic support, an alkali-soluble layer and provided on the alkali-soluble layer a recording layer which contains an infrared ray absorbent, an alkali-soluble resin and an inhibitor of inhibiting the alkali-soluble resin from dissolving in an alkali aqueous developer and increases in the solubility in an alkaline aqueous solution upon irradiation of infrared light.

(2) The lithographic printing plate precursor as described in (1) above, wherein the inhibitor is a quaternary ammonium salt compound.

(3) A method for producing a lithographic printing plate comprising exposing a lithographic printing plate precursor comprising a hydrophilic support, an alkali-soluble layer and provided on the alkali-soluble layer a recording layer which contains an infrared ray absorbent, an alkali-soluble resin and an inhibitor of inhibiting the alkali-soluble resin from dissolving in an alkaline aqueous developer and increases in the solubility in an alkaline aqueous solution upon irradiation of infrared light to an infrared laser, and developing an exposed lithographic printing plate precursor with an alkali developer not containing a silicate and comprising an organic compound having a buffering activity and a base.

DETAILED DESCRIPTION OF THE INVENTION

After extensive studies, the present inventors had found that when an alkali-soluble resin and an inhibitor of inhibiting the resin from dissolving in an alkali aqueous developer are added to the recording layer, the scratch resistance is improved. However, there arose a problem that when the inhibitor is merely added to the recording layer, the sensitivity decreases, though the scratch resistance is improved.

This was considered to occur because in the case of a single layer-type recording layer, the heat energy converted by the infrared absorbent escapes into the support such as aluminum having high heat conductivity. Accordingly, in the present invention, the alkali soluble resin-containing layer is provided on a support to have a multilayer structure, and an infrared absorbent, an alkali-soluble resin and the above-described inhibitor are incorporated into the upper layer, whereby the heat generated upon exposure can be effectively used for the dissolution of interaction between the inhibitor and the upper layer, as a result, the reduction of sensitivity can be prevented while improving the scratch resistance.

When a lithographic printing plate precursor is developed with a developer after exposure, the scratch resistance sometimes decreases resulting from the fatigue of developer due to the alkali-soluble resin components dissolved out from the recording layer or the like. Therefore, in the plate-making of a lithographic printing plate from the lithographic printing plate precursor of the present invention, an alkali developer not containing a silicate and mainly comprising a base and an organic compound having a buffering activity, namely, a non-silicate developer is used. The non-silicate developer originally contains an organic material and is considered to cause no problem in respect of the fatigue of developer due to the binder components.

The present invention is described in detail below.

The lithographic printing plate precursor of the present invention has a positive working recording layer having a two-layer structure. A heat-sensitive layer positioned in the upper part contains an infrared absorbing dye, an alkali-soluble resin and an inhibitor of inhibiting the resin from dissolving in an alkali aqueous developer.

The positive working recording layer of the lithographic printing plate precursor of the present invention is described below.

In the present invention, the positive working recording layer is characterized by having a multilayer structure where a recording layer (also called an upper layer) is provided at the position closer to the surface (exposure surface) and a lower layer containing an alkali-soluble resin is provided in the side closer to the support.

These layers each contains a water-insoluble and alkali-soluble resin and at the same time, the recording layer positioned in the upper part must contain an infrared absorbing dye and an inhibitor of inhibiting the alkali-soluble resin from dissolving in an alkali aqueous developer.

Respective constituent components of the lithographic printing plate precursor of the present invention are described below.

<Inhibitor>

The recording layer (also called an upper layer) positioned in the upper part of the lithographic printing plate precursor of the present invention contains an inhibitor of inhibiting the solubility of alkali-soluble resin so as to enhance the scratch resistance.

The inhibitor is not particularly limited and examples of the inhibitor which is ordinarily used include an ammonium salt, a sulfonic acid compound, a sulfonic acid ester, a ketone compound and a polyethylene glycol compound.

Examples of the ammonium salt include a tetraalkylammonium salt, a trialkylarylammonium salt, a dialkyldiarylammonium salt, an alkyltriarylammonium salt, a tetraarylammonium salt, a cyclic ammonium salt and a bicyclic ammonium salt.

Specific examples thereof include tetrabutylammonium bromide, tetrapentylammonium bromide, tetrahexylammonium bromide, tetraoctylammonium bromide, tetralaurylammonium bromide, tetraphenylammonium bromide, tetranaphthylammonium bromide, tetrabutylammonium chloride, tetrabutylammonium iodide, tetrastearylammonium bromide, lauryltrimethylammonium bromide, stearyltrimethylammonium bromide, behenyltrimethylammonium bromide, lauryltriethylammonium bromide, phenyltrimethylammonium bromide, 3-trifluoromethylphenyltrimethylammonium bromide, benzyltrimethylammonium bromide, dibenzyldimethylammonium bromide, distearyldimethylammonium bromide, trioctylmethylammonium bromide, tristearylmethylammonium bromide, benzyltriethylammonium bromide, hydroxyphenyltrimethylammonium bromide and N-methylpyridinium bromide.

Examples of the sulfonic acid ester include methyl paratoluenesulfonate, phenyl paratoluenesulfonate and methyl naphthalenesulfonate. Examples of the ketone compound include benzophenone, 3,4,5-trihydroxybenzophenone and 2,2'-dihydroxy-4,4'-dihexoxybenzophenone. Examples of the polyethylene glycol compound include polyethylene glycol 1000, polyethylene glycol 4000, polyethylene glycol 10000 and polyethylene glycol 1000 distearoyl ester.

Among these compounds, ammonium salt compounds, particularly, quaternary ammonium salt compounds are preferred because they exhibit excellent property in the interaction with the alkali-soluble resin and in the dissolution of interaction upon exposure.

The amount of the inhibitor added is from 0.1 to 30 wt %, preferably from 0.5 to 20 wt % based on the entire solid content of the upper layer. If the amount added is less than 0.1 wt %, the interaction is insufficient, whereas if it exceeds 30 wt %, the inhibitor, which fails to interact with the alkali-soluble resin, accelerates the permeation of developer to cause a problem in the image-forming property.

<Alkali-soluble Resin which Interacts with Inhibitor>

The upper layer of the lithographic printing plate precursor of the present invention contains an alkali-soluble resin which interacts with the inhibitor. Examples of the alkali-soluble resin include a novolak resin (particularly, xylenol novolak) and a polymer having a phenolic hydroxyl group.

Specific examples of the novolak resin (particularly, xylenol novolak) and the polymer having a phenolic hydroxyl group include 2,3-xylenol/m-cresol/p-cresol/phenol novolak, 2,5-xylenol/m-cresol/p-cresol/phenol novolak, 3,5-xylenol/m-cresol/p-cresol/phenol novolak, 2,5-xylenol/phenol novolak, 3,5-xylenol/m-cresol/p-cresol novolak, 2,3-xylenol/m-cresol/phenol novolak, m,p-cresol novolak, o,p-cresol novolak, o-cresol novolak, m-cresol novolak, p-cresol novolak, phenol novolak, poly(p-hydroxystyrene) and polyhydroxyphenyl methacrylamide.

<Infrared Absorbing Dye>

The infrared absorbing dye contained in the upper layer of the lithographic printing plate precursor of the present invention is not particularly limited insofar as it is a dye of absorbing infrared light to generate heat, and various dyes known as infrared absorbing dyes can be used.

Examples of the infrared absorbing dye which can be used in the present invention include commercially available dyes and known dyes described in publications (for example, *Senryo Binran* (*Handbook of Dyes*), compiled by Yuki Gosei Kagaku Kyokai (1970)). Specific examples thereof include dyes, for example, azo dye, metal complex salt azo dye, pyrazolone azo dye, anthraquinone dye, phthalocyanine dye, carbonium dye, quinoneimine dye, methine dye and cyanine dye. Among these dyes, those absorbing infrared light or near infrared light are particularly preferred in the present invention, because they are suitable for use with a laser emitting infrared or near infrared light.

Examples of the dye of absorbing infrared or near infrared light include cyanine dyes described in JP-A-58-125246 (the term "JP-A" as used herein means an "unexamined published Japanese patent application"), JP-A-59-84356, JP-A-59-202829 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792 and cyanine dyes described in British Patent 434,875.

Other examples of the dye which can be preferably used include near infrared absorbing sensitizers described in U.S. Pat. No. 5,156,938, substituted arylbenzo(thio)pyrylium salts described in U.S. Pat. No. 3,881,924, trimethinethiapyrylium salts described in JP-A-57-142645 (U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, pyrylium compounds described in JP-B-5-13514 (the term "JP-B" as used herein means an "examined Japanese patent publication") and JP-B-5-19702, and commercially available products, for example, Epolight III-178, Epolight III-130 and Epolight III-125 (produced by Epolin Inc.).

Other preferred examples of the dye include near infrared absorbing dyes represented by formulae (I) and (II) of U.S. Pat. No. 4,756,993.

The infrared absorbing dye can be added not only to the upper layer but also to the lower layer. When the infrared absorbing dye is added to the lower layer, the lower layer can also function same as the upper layer. In the case of adding the infrared absorbing dye to the lower layer, the dye may be the same as or different from the dye added to the upper layer.

Also, the infrared absorbing dye may be added to a layer containing other components, or a different layer provided for adding the infrared absorbing dye. In the case of providing a different layer, the layer is preferably a layer adjacent to the upper layer. The dye and the alkali-soluble resin which is described later are preferably contained in the same layer but may be contained in different layers.

The amount of the infrared absorbing dye added to the upper layer is from 0.01 to 50 wt %, preferably from 0.1 to 10 wt %, more preferably from 0.5 to 10 wt %, based on the total solid content of the upper layer. If the amount of the dye added is less than 0.01 wt %, the sensitivity lowers, whereas if it exceeds 50 wt %, the uniformity of upper layer is lost and the durability of upper layer is deteriorated.

In addition, the upper layer of the lithographic printing plate precursor of the present invention may contain an alkali-soluble polymer compound same as one contained in the lower layer to such an extent of not inhibiting the action of the present invention. The alkali-soluble polymer compound is described later.

The alkali-soluble layer (lower layer) of the lithographic printing plate precursor of the present invention is described below.

<Alkali-soluble Polymer Compound>

The lower layer of the lithographic printing plate precursor of the present invention contains a water-insoluble and alkali-soluble polymer compound (hereinafter sometimes referred to as an alkali-soluble polymer or an alkali-soluble resin). The alkali-soluble polymer includes a homopolyiner or copolymer containing an acidic group in the main chain and/or side chain thereof, and a mixture thereof. Accordingly, the lower layer for use in the present invention has a feature of dissolving upon contact with an alkaline developer.

The alkali-soluble polymer for use in the lower layer of the present invention is not particularly limited and conventionally known alkali-soluble polymer can be used. A polymer compound having any one functional group of (1) a phenolic hydroxyl group, (2) a sulfonamido group and (3) an active imido group in its molecule is preferred. Examples thereof are described below, however, the present invention is not limited thereto.

Examples of the polymer compound having (1) a phenolic hydroxyl group include novolak resins such as phenolformaldehyde resin, m-cresolformaldehyde resin, p-cresolformaldehyde resin, m-/p-mixed cresolformaldehyde resin and phenol/cresol (the cresol may be any one of m-cresol, p-cresol and m-/p-mixed cresol) mixed formaldehyde resin, and pyrogallol acetone resins. A polymer compound having a phenolic hydroxyl group in the side chain is also preferably used as the polymer compound having a phenolic hydroxyl group. Examples of the polymer compound having a phenolic hydroxyl group in the side chain include polymer compounds obtained by homopolymerizing a polymerizable monomer of a low molecular compound having one or more phenolic hydroxyl group and one or more polymerizable unsaturated bond, or copolymerizing such a monomer with another polymerizable monomer.

Examples of the polymerizable monomer having a phenolic hydroxyl group include an acrylamide, a methacrylamide, an acrylic acid ester and a methacrylic acid ester each having a phenolic hydroxyl group and a hydroxystyrene. Specific examples thereof include N-(2-hydroxyphenyl)acrylamide, N-(3-hydroxyphenyl)acrylamide, N-(4-hydroxyphenyl)acrylamide, N-(2-hydroxyphenyl)methacrylamide, N-(3-hydroxyphenyl)methacrylamide, N-(4-hydroxyphenyl)methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl)ethyl acrylate, 2-(3-hydroxyphenyl)ethyl acrylate, 2-(4-hydroxyphenyl)ethyl acrylate, 2-(2-hydroxyphenyl)ethyl methacrylate, 2-(3-hydroxyphenyl)ethyl methacrylate and 2-(4-hydroxyphenyl)ethyl methacrylate. These resins having a phenolic hydroxyl group may be used in combination of two or more thereof. In addition, a condensation polymerization product of a phenol containing an alkyl group having from 3 to 8 carbon atoms as a substituent with formaldehyde, for example, tert-butylphenolformaldehyde resin or octylphenolformaldehyde resin, described in U.S. Pat. No. 4,123,279 may be used together.

Examples of the alkali-soluble polymer compound having (2) a sulfonamido group include polymer compounds obtained by homopolymerizing a polymerizable monomer having a sulfonamide group, or copolymerizing such a monomer with another polymerizable monomer. Examples of the polymerizable monomer having a sulfonamido group include a polymerizable monomer of a low molecular compound having one or more sulfonamido group having bonded on the nitrogen atom thereof at least one hydrogen atom, represented by $—NH—SO_2—$, and one or more polymerizable unsaturated bond. Among these compounds, low molecular compounds having an acryloyl group, an allyl group or a vinyloxy group, and an unsubstituted or mono-substituted aminosulfonyl group or a substituted sulfonylimino group are preferred.

The alkali-soluble polymer compound having (3) an active imido group preferably has the active imido group in its molecule. Examples of such a polymer compound include polymer compounds obtained by homopolymerizing a polymerizable monomer of a low molecular compound having one or more active imido group and one or more polymerizable unsaturated bond in its molecule, or copolymerizing the above-described monomer with another polymerizable monomer.

Specific examples of such a compound which can be suitably used include N-(p-toluenesulfonyl)methacrylamide and N-(p-toluenesulfonyl)acrylamide.

The alkali-soluble polymer compound for use in the present invention is preferably a polymer compound obtained by polymerizing two or more of the polymerizable monomer having a phenolic hydroxyl group, the polymerizable monomer having a sulfonamido group and the polymerizable monomer having an active imido group, or a polymer compound obtained by copolymerizing two or more of these polymerizable monomers with another polymerizable monomer. In the case of copolymerizing the polymerizable monomer having a phenolic hydroxyl group with the polymerizable monomer having a sulfonamido group and/or the polymerizable monomer having an active imido group, a weight ratio of the former monomer to the latter monomer(s) is preferably from 50:50 to 5:95, more preferably from 40:60 to 10:90.

In the present invention, when the alkali-soluble polymer is a copolymer of the polymerizable monomer having a phenolic hydroxyl group, the polymerizable monomer having a sulfonamido group or the polymerizable monomer having an active imido group with another polymerizable monomer, the monomer of imparting alkali solubility is preferably contained in an amount of 10 mol % or more, more preferably 20 mol % or more. If the monomer component of imparting alkali solubility is less than 10 mol %, insufficient alkali solubility is liable to result and the effect of improving the development latitude may not be achieved satisfactorily.

Examples of the monomer component copolymerized with the polymerizable monomer having a phenolic hydroxyl group, the polymerizable monomer having a sulfonamido group or the polymerizable group having an active imido group include the compounds set forth in the following (m1) to (m12), however, the present invention is not limited thereto.

(m1) Acrylic acid esters and methacrylic acid esters having an aliphatic hydroxyl group, for example, 2-hydroxyethyl acrylate and 2-hydroxyethyl methacrylate.

(m2) Alkyl acrylates, for example, methyl acrylate, ethyl acrylate, propyl acrylate, butyl acrylate, amyl acrylate, hexyl acrylate, octyl acrylate, benzyl acrylate, 2-chloroethyl acrylate and glycidyl acrylate.

(m3) Alkyl methacrylates, for example, methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate and glycidyl methacrylate.

(m4) Acrylamides and methacrylamides, for example, acrylamide, methacrylamide, N-methylolacrylamide, N-ethylacrylamide , N-hexylmethacrylamide , N-cyclohexylacrylamide, N-hydroxyethylacrylamide, N-phenylacrylamide, N-nitrophenylacrylamide and N-ethyl-N-phenylacrylamide.

(m5) Vinyl ethers, for example, ethyl vinyl ether, 2-chloroethyl vinyl ether, hydroxyethyl vinyl ether, propyl vinyl ether, butyl vinyl ether, octyl vinyl ether and phenyl vinyl ether.

(m6) Vinyl esters, for example, vinyl acetate, vinyl chloroacetate, vinyl butyrate and vinyl benzoate.

(m7) Styrenes, for example, styrene, α-methylstyrene, methyl styrene and chloromethylstyrene.

(m8) Vinyl ketones, for example, methyl vinyl ketone, ethyl vinyl ketone, propyl vinyl ketone and phenyl vinyl ketone.

(m9) Olefins, for example, ethylene, propylene, isobutylene, butadiene and isoprene.

(m10) N-vinylpyrrolidone, acrylonitrile and methacrylonitrile.

(m11) Unsaturated imides, for example, maleimide, N-acryloylacrylamide, N-acetylmethacrylamide, N-propionylmethacrylamide and N-(p-chlorobenzoyl) methacrylamide.

(m12) Unsaturated carboxylic acids, for example, acrylic acid, methacrylic acid, maleic anhydride and itaconic acid.

The alkali-soluble polymer compound preferably has a phenolic hydroxyl group and preferred examples thereof include novolak resins such as phenolformaldehyde resin, m-cresolformaldehyde resin, p-cresolformaldehyde resin, m-/p-mixed cresolformaldehyde resin and phenol/cresol (the cresol may be m-cresol, p-cresol or m-/p-mixed cresol) mixed formaldehyde resin, and pyrogallol acetone resins.

Other examples of the alkali-soluble polymer compound having a phenolic hydroxyl group include condensation polymerization products of aldehyde with a phenol containing an alkyl group having from 3 to 8 carbon atoms as a substituent, for example, tert-butylphenolformaldehyde resin and octylphenolformaldehyde resin, described in U.S. Pat. No. 4,123,279.

As a copolymerization method for forming the alkali-soluble polymer compound, conventionally known graft copolymerization, block copolymerization, random copolymerization or the like can be used.

In the present invention, when the alkali-soluble polymer is a homopolymer or copolymer of the polymerizable monomer having a phenolic hydroxyl group, the polymerizable monomer having a sulfonamido group or the polymerizable monomer having an active imido group, the polymer preferably has a weight average molecular weight of 2,000 or more and a number average molecular weight of 500 or more, more preferably a weight average molecular weight of 5,000 to 300,000, a number average molecular weight of 800 to 250,000 and a dispersion degree (weight average molecular weight/number average molecular weight) of 1.1 to 10.

In the present invention, when the alkali-soluble polymer is a resin such as phenolformaldehyde resin or cresolaldehyde resin, the polymer preferably has a weight average molecular weight of 500 to 20,000 and a number average molecular weight of 200 to 10,000.

In view of the image formation at the development, the alkali-soluble polymer for use in the lower layer is preferably an acrylic resin because the lower layer can maintain good solubility in an alkali developer mainly comprising an organic compound having a buffering activity and a base. The acrylic resin is preferably an acrylic resin having a sulfonamido group.

The alkali-soluble polymer compounds may be used individually or in combination of two or more thereof. The amount of the alkali-soluble polymer compound added is from 30 to 99 wt %, preferably from 40 to 95 wt %, more preferably from 50 to 90 wt %, based on the entire solid content of the lower layer. If the amount of the alkali-soluble polymer added is less than 30 wt %, the durability of the lower layer is worsened, whereas if it exceeds 99 wt %, a problem arises in both the sensitivity and the durability.

<Other Components>

In forming the upper or lower layer, various additives may be further added, if desired, in addition to the above-described essential components insofar as the effect of the present invention is not impaired. The additive may be incorporated only into the lower layer, only into the upper layer, or into both layers. Examples of the additives are described below.

For improving the effect of inhibiting dissolution of the image area into a developer, a substance, which is heat decomposable and in a non-decomposed state, substantially reduces the solubility of the alkali-soluble polymer compound, for example, onium salt, o-quinonediazide compound, aromatic sulfone compound and aromatic sulfonic acid ester compound, is preferably used together. Examples of the onium salt include diazonium salt, ammonium salt, phosphonium salt, iodonium salt, sulfonium salt, selenonium salt and arsonium salt.

Suitable examples of the onium salt for use in the present invention include diazonium salts described in S. I.

Schlesinger, *Photogr. Sci. Eng.*, 18, 387 (1974), T. S. Bal et al., *Polymer,* 21, 423 (1980), and JP-A-5-158230, ammonium salts described in U.S. Pat. Nos. 4,069,055 and 4,069,056, and JP-A-3-140140, phosphonium salts described in D. C. Necker et al., *Macromolecules,* 17, 2468 (1984), C. S. Wen et al., *Teh, Proc. Conf. Rad. Curing ASIA, p.* 478, Tokyo, October (1988), and U.S. Pat. Nos. 4,069,055 and 4,069,056, iodonium salts described in J. V. Crivello et al., *Macromolecules,* 10 (6), 1307 (1977), *Chem. & Eng. News*, November 28, p. 31 (1988), European Patent 104,143, U.S. Pat. Nos. 339,049 and 410,201, JP-A-2-150848 and JP-A-2-296514, sulfonium salts described in J. V. Crivello et al., *Polymer J.,* 17, 73 (1985), J. V. Crivello et al., *J. Org. Chem.*, 43, 3055 (1978), W. R. Watt et al., *J. Polymer Sci., Polymer Chem. Ed.,* 22, 1789 (1984), J. V. Crivello et al., *Polymer Bull.,* 14, 279 (1985), J. V. Crivello et al., *Macromolecules,* 14 (5), 1141 (1981), J. V. Crivello et al., *J. Polymer Sci., Polymer Chem. Ed.,* 17, 2877 (1979), European Patents 370,693, 233,567, 297,443 and 297,442, U.S. Pat. Nos. 4,933,377, 3,902,114, 410,201, 339,049, 4,760,013, 4,734,444 and 2,833,827, and German Patents 2,904,626, 3,604,580 and 3,604,581, selenonium salts described in J. V. Crivello et al., *Macromolecules,* 10 (6), 1307 (1977), and J. V. Crivello et al., *J. Polymer Sci., Polymer Chem. Ed.,* 17, 1047 (1979), and arsonium salts described in C. S. Wen et al., *Teh, Proc. Conf. Rad. Curing ASIA, p.* 478, Tokyo, Oct. (1988).

Among the onium salts, diazonium salt is preferred. Particularly preferred examples of the diazonium salt include those described in JP-A-5-158230.

Examples of the counter ion of the onium salt include tetrafluoroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoylbenzenesulfonic acid and paratoluenesulfonic acid. Among these compounds, preferred are alkylaromatic sulfonic acids, for example, hexafluorophosphoric acid, triisopropylnaphthalenesulfonic acid and 2,5-dimethylbenzenesulfonic acid.

The onium salt may be added to either the upper layer or the lower layer but in view of the image-forming property, is preferably added to the lower layer.

Preferred examples of the quinonediazides include o-quinonediazide compounds. The o-quinonediazide compound for use in the present invention is a compound having at least one o-quinonediazido group, which increases in the alkali solubility upon thermal decomposition, and compounds having various structures can be used. In other words, o-quinonediazide assists dissolution of the photosensitive system by its two effects, namely, the o-quinonediazide loses the capability of inhibiting the dissolution of the binder upon thermal decomposition and the o-quinonediazide itself changes into an alkali-soluble substance. Examples of the o-quinonediazide compound which can be used in the present invention include the compounds described in J. Kosar, *Light-Sensitive Systems*, pp. 339–352, John Wiley & Sons, Inc. In particular, sulfonic acid esters or sulfonic acid amides of o-quinonediazide, obtained by reacting various aromatic polyhydroxy compounds or aromatic amino compounds, are preferred. Also, an ester of benzoquinone-(1,2)-diazidosulfonic chloride or naphthoquinone-(1,2)-diazide-5-sulfonic chloride with a pyrogallol-acetone resin described in JP-B-43-28403, and an ester of benzoquinone-(1,2)-diazidosulfonic chloride or naphthoquinone-(1,2)-diazido-5-sulfonic chloride with a phenol-formaldehyde resin described in U.S. Pat. Nos. 3,046,120 and 3,188,210 are preferably used.

Furthermore, an ester of naphthoquinone-(1,2)-diazido-4-sulfonic chloride with a phenol-formaldehyde resin or cresol-formaldehyde resin, and an ester of naphthoquinone-(1,2)-diazido-4-sulfonic chloride with a pyrogallol-acetone resin are also preferably used. Other useful o-quinonediazide compounds are described in a large number of patents, for example, in JP-A-47-5303, JP-A-48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,544,323, 3,573,917, 3,674,495 and 3,785,825, British Patents 1,227,602, 1,251,345, 1,267,005, 1,329,888 and 1,330,932, and German Patent 854,890.

The amount of the o-quinonediazide compound added is preferably from 1 to 50 wt %, more preferably from 5 to 30 wt %, still more preferably from 10 to 30 wt %, based on the total solid content of the layer. These compounds may be used individually or as a mixture of a plurality of the compounds.

The amount of the additive other than the o-quinonediazide compound is preferably from 1 to 50 wt %, more preferably from 5 to 30 wt %, still more preferably from 10 to 30 wt %. The additive and the alkali-soluble polymer for use in the present invention are preferably incorporated into the same layer.

For intensifying the discrimination of image or enhancing the resistance of the surface against scratches, a polymer having, as a polymerization component, a (meth)acrylate monomer containing two or three perfluoroalkyl groups having from 3 to 20 carbon atoms in the molecule thereof described in JP-A-2000-187318 is preferably used together. Such a polymer may be incorporated into either the upper layer or the lower layer but for attaining higher effect, is incorporated into the upper layer.

The polymer is preferably added in an amount of from 0.1 to 10 wt %, more preferably from 0.5 to 5 wt %, based on the total solid content of the upper layer.

In the printing plate precursor of the present invention, a compound capable of decreasing the coefficient of static friction on the surface may be added for the purpose of imparting resistance against scratches. Specific examples thereof include long-chain alkyl carboxylic acid esters described in U.S. Pat. No. 6,117,913. The compound may be incorporated into either the lower layer or the upper layer but for attaining higher effect, is incorporated into the upper layer.

The compound is preferably added in an amount of from 0.1 to 10 wt %, more preferably from 0.5 to 5 wt %, based on the total solid content of the layer.

In the present invention, the lower layer or the upper layer may contain, if desired, a low molecular weight compound having an acidic group. Examples of the acidic group include a sulfonic acid group, a carboxylic acid group and a phosphoric acid group. Among these compounds, a compound having a sulfonic acid group is preferred. Specific examples thereof include aromatic sulfonic acids, e.g., p-toluenesulfonic acid or naphthalenesulfonic acid and aliphatic sulfonic acids.

The compound may be incorporated into either the lower layer or the upper layer. The compound is preferably added in an amount of from 0.05 to 5 wt %, more preferably from 0.1 to 3 wt %, based on the total solid content of the layer.

When the amount exceeds 5 wt %, the solubility of the layer in a developer disadvantageously increases.

Furthermore, in the present invention, various dissolution inhibitors may be incorporated for the purpose of controlling the solubility of the lower layer or the upper layer. Preferred examples of the dissolution inhibitor include disulfone compounds and sulfone compounds disclosed in JP-A-11-119418. Specific examples of the dissolution inhibitor which is preferably used include 4,4'-bishydroxyphenylsulfone.

The compound may be incorporated into either the lower layer or the upper layer. The compound is preferably added in an amount of from 0.05 to 20 wt %, more preferably from 0.5 to 10 wt %, based on the total solid content of the layer.

For the purpose of further increasing the sensitivity, a cyclic acid anhydride, a phenol or an organic acid may be used together. Examples of the cyclic acid anhydride which can be used include phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride and pyromellitic anhydride described in U.S. Pat. No. 4,115,128. Examples of the phenol include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane. Examples of the organic acid include sulfonic acids, sulfinic acids, alkylsulfuric acids, phosphonic acids, phosphoric acid esters and carboxylic acids described in JP-A-60-88942 and JP-A-2-96755. Specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid. The content of the cyclic acid anhydride, phenol or organic acid in the layer is preferably from 0.05 to 20 wt %, more preferably from 0.1 to 15 wt %, still more preferably from 0.1 to 10 wt %, based on the total solid content of the layer.

In addition, for enhancing the stability of processing to development conditions, the coating solution for the lower layer or the upper layer for use in the present invention may contain a nonionic surfactant described in JP-A-62-251740 and JP-A-3-208514, an amphoteric surfactant described in JP-A-59-121044 and JP-A-4-13149, a siloxane compound described in EP 950517, or a fluorine-containing copolymer described in JP-A-11-288093.

Specific examples of the nonionic surfactant include sorbitan tristearate, sorbitan monopalmitate, sorbitan trioleate, stearic acid monoglyceride and polyoxyethylene nonylphenyl ether. Specific examples of the amphoteric surfactant include alkyldi(aminoethyl)glycine, alkylpolyaminoethylglycine hydrochloride, and 2-alkyl-N-carboxyethyl-N-hydroxyethylimidazolium betaine or N-tetradecyl-N,N-betaine type surfactant (e.g., Amorgen K, trade name, produced by Dai-ich Kogyo Seiyaku Co., Ltd.).

The siloxane compound is preferably a block copolymer of dimethylsiloxane and polyalkylene oxide. Specific examples thereof include polyalkylene oxide-modified silicones, e.g., DBE-224, DBE-621, DBE-712, DBP-732, DBP-534 (all produced by Chisso Corp.) and Tego Glide 100 (produced by Tego A.G.).

The content of the nonionic surfactant or amphoteric surfactant is preferably from 0.05 to 15 wt %, more preferably from 0.1 to 5 wt % in the coating solution.

The lower layer or upper layer for use in the present invention may contain a printing-out agent for obtaining a visible image immediately after the heating upon exposure, or a dye or pigment serving as an image-coloring agent.

A representative example of the printing out agent includes a combination of a compound capable of releasing an acid under heating by exposure (photo-acid releasing agent) and an organic dye capable of forming a salt. Specific examples thereof include a combination of o-naphthoquinonediazido-4-sulfonic acid halogenide and a salt-forming organic dye described in JP-A-50-36209 and JP-A-53-8128, and a combination of a trihalomethyl compound and a salt-forming organic dye described in JP-A-53-36223, JP-A-54-74728, JP-A-60-3626. JP-A-61-143748, JP-A-61-151644 and JP-A-63-58440. The trihalomethyl compound includes an oxazole compound and a triazine compound, and both compounds have excellent storage stability and give a clear print-out image.

Examples of the image-coloring agent which can be used include the above-described salt-forming organic dyes and other dyes. Preferred dyes include an oil-soluble dye and a basic dye, as well as the salt-forming organic dye. Specific examples thereof include Oil Yellow #101, Oil Yellow #103, Oil Ping #312, Oil Green BG, Oil Blue BOS, Oil Blue #603, Oil Black BY, Oil Black BS, Oil Black T-505 (all produced by Orient Chemical Industry Co., Ltd.), Victoria Pure Blue, Crystal Violet (CI42555), Methyl Violet (CI42535), Ethyl Violet, Rhodamine B (CI45170B), Malachite Green (CI42000) and Methylene Blue (CI52015). The dyes described in JP-A-62-293247 are particularly preferred. The dye can be added to the printing plate precursor in an amount of from 0.01 to 10 wt %, preferably from 0.1 to 3 wt %, based on the total solid content of the printing plate precursor.

In the printing plate precursor of the present invention, a plasticizer is added, if desired, so as to impart flexibility or the like to the coating film. Examples of the plasticizer include butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers and polymers of acrylic acid or methacrylic acid.

The upper layer and the lower layer of the lithographic printing plate precursor of the present invention each can be formed by dissolving the above-described components in a solvent and coating the resulting solution on an appropriate support.

Examples of the solvent used include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone and toluene, however, the present invention is not limited thereto. These solvents may be used individually or as a mixture thereof.

The solvent used for coating is preferably selected such that its solubility to the alkali-soluble polymer used in the upper layer is different from its solubility to the alkali-soluble polymer used in the lower layer. More specifically, when the lower layer is coated and then the upper layer is coated adjacently thereto, if a solvent capable of dissolving the alkali-soluble polymer of the lower layer is used as the solvent for coating of the upper layer, the mixing at the interface between layers cannot be neglected and at the extreme, a uniform single layer is formed without forming multiple layers. If two adjacent layers are mixed at the interface or mingle with each other to show a behavior like a uniform layer, the effect of the present invention obtained by having two layers is disadvantageously impaired. Accordingly, the solvent used for coating of the upper layer is preferably a poor solvent for the alkali-soluble polymer contained in the lower layer.

In the solution used for coating of each layer, the concentration of the above-described components (total solid content including additives) is preferably from 1 to 50 wt %.

The coated amount (solid basis) of the upper layer or the lower layer on the support, after coating and drying, may vary depending on the use end but is preferably from 0.05 to 1.0 $g/m^2$ for the upper layer and from 0.3 to 3.0 $g/m^2$ for the lower layer. If the coated amount of upper layer is less than 0.05 $g/m^2$, the image-forming property may deteriorate, whereas if it exceeds 1.0 $g/m^2$, the sensitivity may decrease. If the coated amount of the lower layer is less than or more than the above-described range, the image-forming property is liable to deteriorate. The total coated amount of two layers is preferably from 0.5 to 3.0 $g/m^2$. If the total coated amount is less than 0.5 $g/m^2$, the film property may be reduced, whereas if it exceeds 3.0 $g/m^2$, the sensitivity is liable to decrease. As the coated amount is smaller, the apparent sensitivity becomes higher but the film property of the upper and lower layers is more reduced.

For the coating, various methods may be used and examples thereof include bar coater coating, rotary coating, spray coating, curtain coating, dip coating, air knife coating, blade coating and roll coating.

The upper layer and the lower layer for use in the present invention each may contain a surfactant for improving the coatability and examples of the surfactant include fluorine-containing surfactants described in JP-A-62-170950. The amount of the surfactant added is preferably from 0.01 to 1 wt %, more preferably from 0.05 to 0.5 wt %, based on the total solid content of the lower or upper layer.

<Support>

The support used for the lithographic printing plate precursor of the present invention is a dimensionally stable plate-like material having necessary strength and durability. Examples thereof include paper, paper laminated with plastic (for example, polyethylene, propylene or polystyrene), a metal plate (e.g., aluminum, zinc or copper plate), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film), and paper or plastic film having laminated or deposited thereon a metal described above.

The support for use in the present invention is preferably a polyester film or an aluminum plate. Among them, the aluminum plate is more preferred, since it is dimensionally stable and relatively inexpensive. The aluminum plate is preferably a pure aluminum plate or an alloy plate mainly comprising aluminum and containing a trace amount of foreign element. A plastic film having laminated or deposited thereon aluminum may also be used. Examples of the foreign element contained in the aluminum alloy include silicon, iron, manganese, copper, magnesium, chromium, zinc, bismuth, nickel and titanium. The content of foreign element in the alloy is at most 10 wt % or less. In the present invention, particularly preferred aluminum is pure aluminum but since perfectly pure aluminum is difficult to produce in view of refining technique, the aluminum may contain trace foreign element.

The aluminum plate for use in the present invention is not particularly limited on the composition and an aluminum plate conventionally known and commonly used can be appropriately used. The thickness of the aluminum plate for use in the present invention is approximately from 0.1 to 0.6 mm, preferably from 0.15 to 0.4 mm, more preferably from 0.2 to 0.3 mm.

In advance of surface-roughening an aluminum plate, a degreasing treatment using, for example, a surfactant, an organic solvent or an alkaline aqueous solution is performed, if desired, so as to remove the rolling oil on the surface. The surface roughening treatment of the aluminum plate is performed by various methods, for example, by a method of mechanically roughening the surface, a method of electrochemically dissolving and roughening the surface, or a method of chemically dissolving selectively the surface. In the mechanical method, a known method, for example, ball graining, brush graining, blast graining or buff graining may be used. The electrochemical surface roughening method includes a method of performing the treatment by passing an alternating current or direct current through an electrolytic solution containing hydrochloric acid or nitric acid. A method using these two treatments in combination disclosed in JP-A-54-63902 may also be used. After such surface roughening, the aluminum plate is, if desired, subjected to an alkali etching treatment and a neutralization treatment and then, if desired, to an anodization treatment so as to enhance the water retentivity or abrasion resistance on the surface. The electrolyte which can be used in the anodization treatment of the aluminum plate includes various electrolytes capable of forming a porous oxide film, and a sulfuric acid, a phosphoric acid, an oxalic acid, a chromic acid or a mixed acid thereof is ordinarily used. The concentration of the electrolyte is appropriately determined depending on the kind of electrolyte.

The anodization treatment conditions vary depending on the electrolyte used and therefore, cannot be indiscriminately specified, however, suitable conditions are ordinarily such that the concentration of electrolyte is from 1 to 80 wt %, the liquid temperature is from 5 to 70° C., the current density is from 5 to 60 $A/dm^2$, the voltage is from 1 to 100 V, and the electrolysis time is from 10 seconds to 5 minutes. If the amount of anodic oxide film is less than 1.0 $g/m^2$, insufficient press life may result or the non-image area of lithographic printing plate is readily scratched to cause so-called "scratch toning", namely, adhesion of ink to the scratched part at the printing. After the anodization treatment, the aluminum surface is, if desired, subjected to a hydrophilization treatment. Examples of the hydrophilization treatment for use in the present invention include a method of using an alkali metal silicate (for example, an aqueous sodium silicate solution) disclosed in U.S. Pat. Nos. 2,714,066, 3,181,461, 3,280,734 and 3,902,734. According to the method, the support is immersed or electrolyzed in an aqueous sodium silicate solution. Further, a method of treating the support with potassium fluorozirconate disclosed in JP-B-36-22063 or with polyvinylphosphonic acid disclosed in U.S. Pat. Nos. 3,276,868, 4,153,461 and 4,689,272 may be used.

The lithographic printing plate precursor of the present invention comprises at least two layers of a positive working recording layer and a lower layer on a support but, if desired, an undercoat layer may be provided between the support and the lower layer.

For components of the undercoat layer, various organic compounds are used and examples thereof include carboxymethyl cellulose; dextrin; gum arabi; phosphonic acids having an amino group, e.g., 2-aminoethylphosphonic acid; organic phosphonic acids, e.g., phenylphosphonic acid, naphthylphosphonic acid, alkyl phosphonic acid, glycerophosphonic acid, methylenediphosphonic acid and ethylenediphosphonic acid, each of which may have a substituent; organic phosphoric acids, e.g., phenylphosphoric acid, naphthylphosphoric acid, alkylphosphoric acid and glycerophosphoric acid, each of which may have a substituent; organic phosphinic acids, e.g., phenylphosphinic acid, naphthylphosphinic acid, alkylphosphinic acid and glycerophosphinic acid, each of which may have a substituent; amino acids, e.g., glycine and β-alanine; and hydrochlorides of amine having a hydroxy group, e.g., hydrochloride of triethanolamine. The compounds may be used as a mixture of two or more thereof.

An organic undercoat layer containing at least one compound selected from organic polymer compounds having a structural unit represented by the following formula is also preferred.

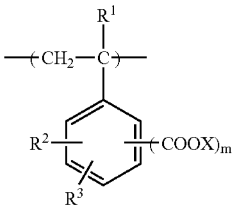

wherein $R^1$ represents a hydrogen atom, a halogen atom or an alkyl group, R2 and $R^3$ each independently represents a hydrogen atom, a hydroxyl group, a halogen atom, an alkyl group, a substituted alkyl group, an aryl group, a substituted aryl group, $-OR^4$, $-COOR^5$, $-CONHR^6$, $-COR^7$ or —CN, or $R^2$ and $R^3$ may combine to form a ring, $R^4$ to R7 each independently represents an alkyl group or an aryl group, X represents a hydrogen atom, a metal atom or $-NR^8R^9R^{10}R^{11}$, $R^8$ to $R^{11}$ each independently represents a hydrogen atom, an alkyl group, a substituted alkyl group, an aryl group or a substituted aryl group, or $R^8$ and $R^9$ may combine to form a ring, and m represents an integer of 1 to 3.

The organic undercoat layer can be provided by a method of dissolving the above-described organic compound in water, an organic solvent, e.g., methanol, ethanol or methyl ethyl ketone, or a mixed solvent thereof, coating the solution on an aluminum plate and drying it, or a method of dissolving the organic compound in water, an organic solvent, e.g., methanol, ethanol or methyl ethyl ketone, or a mixed solvent thereof, immersing an aluminum plate in the solution to adsorb the compound, washing the aluminum plate with water or the like, and drying it. In the former method, the solution containing the organic compound in a concentration of 0.005 to 10 wt % can be coated by various methods. In the latter method, the concentration of the solution is from 0.01 to 20 wt %, preferably from 0.05 to 5 wt %, the immersion temperature is from 20 to 90° C., preferably from 25 to 50° C., and the immersion time is from 0.1 second to 20 minutes, preferably from 2 seconds to 1 minute. The solution used may also be adjusted its PH to a range of from 1 to 12 with a basic substance, e.g., ammonia, triethylamine or potassium hydroxide or by an acidic substance, e.g., hydrochloric acid or phosphoric acid.

The coverage of the organic undercoat layer is suitably from 2 to 200 $mg/m^2$, preferably from 5 to 100 $mg/m^2$. If the coverage is less than 2 $mg/m^2$, sufficiently high printing durability cannot be obtained and if it exceeds 200 $mg/m^2$, the same also occurs.

The positive working lithographic printing plate precursor is imagewise exposed and then subjected to development.

Examples of the light source of emitting active light for use in the imagewise exposure include mercury lamp, metal halide lamp, xenon lamp, chemical lamp and carbon arc lamp. Examples of the radiation include electron beam, X ray, ion beam and far infrared ray. Also, g line, i line, deep-UV light or high-density energy beam (laser beam) may be used. Examples of the laser beam include helium-neon laser, argon laser, krypton laser, helium-cadmium laser and KrF excimer laser. In the present invention, a light source having an emission wavelength in the region from near infrared to infrared is preferred, and a solid laser or a semiconductor layer is more preferred.

A developer and replenisher therefor used in the development of the lithographic printing plate precursor of the present invention is preferably a conventionally known alkali developer mainly comprising an organic compound having a buffering activity and a base and containing substantially no silicon dioxide. Such a developer is hereinafter referred to as a "non-silicate developer". The term "containing substantially no silicon dioxide" as used herein means that a slight amount of silicon dioxide as unavoidable impurity or by-product is allowed to be present.

By using the non-silicate developer in the step of developing the lithographic printing plate precursor of the present invention, the effect of preventing generation of scratches is achieved and a good lithographic printing plate having no defect in the image area can be obtained. The developer preferably has a pH of 12.5 to 13.5.

The "non-silicate developer" for use in the plate-making method of the present invention mainly comprises an organic compound having a buffering activity and a base, as described above. Examples of the organic compound having a buffering activity include the compounds having a buffering activity described in JP-A-8-220775, for example, sugars (particularly, those represented by formulae (I) and (II)), oximes (particularly those represented by formula (III)), phenols (particularly those represented by formula (IV)) and fluorinated alcohols (particularly those represented by formula (V)). Among the compounds represented by formulae (I) to (V), those preferred are sugars represented by formulae (I) and (II) and phenols represented by formula (V), and those more preferred are non-reducing sugar, e.g., saccharose of the sugars represented by formulae (I) and (II) and sulfosalicylic acid. The non-reducing sugar includes trehalose-type oligosaccharides where reducing groups are bonded to each other, glycosides where a reducing group of the sugar is bonded to a non-sugar, and sugar alcohols obtained by reducing a sugar with hydrogenation. Any of these compounds are preferably used in the present invention.

Examples of the trehalose-type oligosaccharide include saccharose and trehalose. Examples of the glycosides include alkyl glycoside, phenol glycoside and mustard oil glycoside.

Examples of the sugar-alcohol include D,L-arabitol, ribitol, xylitol, D,L-sorbitol, D,L-mannitol, D,L-iditol, D,L-talitol, dulcitol and allodulcitol.

In addition, maltitol obtained by hydrogenation of disaccharide, and a reduction product (reduced starch syrup) obtained by hydrogenation of oligosaccharide may be preferably used.

Among these non-reducing sugars, sugar-alcohol and saccharose are preferred, and D-sorbitol, saccharose and reduced starch syrup are more preferred because they have a buffering activity in an appropriate pH region.

The non-reducing sugars may be used individually or in combination of two or more thereof. The amount of the non-reducing sugar in the developer is preferably from 0.1 to 30 wt %, more preferably from 1 to 20 wt %.

The base used in combination with the organic compound having a buffering activity can be appropriately selected from conventionally known alkali agents.

Examples of the alkali agent include inorganic alkali agents, for example, sodium hydroxide, potassium hydroxide, lithium hydroxide, trisodium phosphate, tripotassium phosphate, triammonium phosphate, disodium phosphate, dipotassium phosphate, diammonium phosphate, sodium carbonate, potassium carbonate, ammonium carbonate, sodium hydrogencarbonate, potassium hydrogencarbonate, ammonium hydrogencarbonate, sodium borate, potassium borate and ammonium borate, and potassium citrate, tripotassium citrate and sodium citrate.

Other examples of the alkali agent which can be preferably used include organic alkali agents, for example, monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

The alkali agents may be used individually or in combination of two or more thereof.

Among these compounds, sodium hydroxide and potassium hydroxide are preferred because the pH can be adjusted in a wide pH region by controlling the amount added thereof based on the amount of non-reducing sugar.

Furthermore, trisodium phosphate, tripotassium phosphate, sodium carbonate and potassium carbonate are also preferred because they have a buffering activity by themselves.

It is known that in the case of performing the development using an automatic developing machine, by adding an aqueous solution (replenisher) having higher alkalinity than the developer is added to the developer, a large amount of lithographic printing plates can be processed without exchanging the developer in the development tank for a long period of time. In the present invention, such a replenishing system is also preferably used. In the developer and the replenisher, various surfactants and organic solvents may be added, if desired, for the purpose of accelerating or inhibiting the development, dispersing the development scum, or enhancing the ink-receptivity of the image area of the lithographic printing plate. Preferred examples of the surfactant include anionic, cationic, nonionic and amphoteric surfactants. Furthermore, the developer or replenisher may contain, if desired, a reducing agent, for example, hydroquinone, resorcin or a sodium salt or potassium salt of an inorganic acid (e.g., sulfurous acid, hydrogen sulfurous acid), an organic carboxylic acid, a defoaming agent and a water softening agent.

The printing plate developed using the above-described developer and replenisher is subjected to an after-treatment with washing water, a rinsing solution containing a surfactant and the like, or a desensitizing solution containing gum arabi or a starch derivative. These treatments can be used in various combinations for the after-treatment of the lithographic printing plate precursor of the present invention.

Recently, an automatic developing machine for printing plates has been widely used in the plate making and printing industry so as to rationalize and standardize the plate-making operation. In general, the automatic developing machine has a developing part and an after-treatment part and comprises a device for conveying a printing plate, and tanks for respective processing solutions and spraying device. In the development processing, each processing solution pumped up by a pump is sprayed through spray nozzles to the exposed printing plate while horizontally conveying the printing plate. In recent years, a method of processing the printing plate by immersing the plate in processing solution tanks each filled with a processing solution while conveying the printing plate by means of guide rollers in the solution is also known. In such automatic processing, the processing can be performed while replenishing the replenisher to each processing solution in accordance with the amount of processing, the operating time or the like. Furthermore, a so-called disposable processing system of performing the processing using a substantially new processing solution can also be employed.

In the case where the lithographic printing plate obtained from the lithographic printing plate precursor of the present invention through imagewise exposure, development, water washing and/or rinsing and/or gumming has an unnecessary image area (for example, film edge mark of an original film), the unnecessary image area is eliminated. Such elimination is preferably performed by the method described, for example, in JP-B-2-13293, where a eliminating solution is applied to the unnecessary image area, allowed to stand for a predetermined time and thereafter, washed with water. However, the method described in JP-A-59-174842, where the unnecessary image area is irradiated with an active beam guided by an optical fiber and then subjected to development.

The thus-obtained lithographic printing plate is, if desired, coated with a desensitizing gum and then the plate can be used for printing. However, when a lithographic printing plate having higher printing durability is desired, the printing plate is subjected to a burning treatment. In the case of burning the lithographic printing plate, the plate before the burning is preferably treated with a plate burning conditioner described, for example, in JP-B-61-2518, JP-B-55-28062, JP-A-62-31859 and JP-A-61-159655.

The treatment may be performed by a method of applying the plate burning conditioner on the lithographic printing plate using a sponge or an absorbent cotton impregnated with the plate burning conditioner, a method of applying the plate burning conditioner by immersing the printing plate in a vat filled with the plate burning conditioner, or a method of applying the plate burning conditioner using an automatic coater. When the applied amount is made uniform by a squeegee or a squeegee roller after the application, more preferred results can be obtained.

An amount of the plate burning conditioner applied is ordinarily from 0.03 to 0.8 g/$m^2$ (dry weight). The lithographic printing plate applied with the plate burning conditioner is dried, if desired, and then heated at a high temperature by a burning processor (for example, a burning processor "BP-1300" commercially available from Fuji Photo Film Co., Ltd.). The heating temperature and the heating time are preferably from 180 to 300° C. and from 1 to 20 minutes, respectively, though these may be varied depending on the components constituting the image.

The lithographic printing plate after the burning treatment can be subjected, if desired, to conventional treatment, for example, water washing and gumming, however, in the case where a plate burning conditioner containing a water-soluble polymer compound or the like is used, a so-called desensitizing treatment, e.g., gumming can be omitted. The lithographic printing plate obtained through such treatments is mounted on an offset printer and used for printing of a large number of sheets.

The present invention is described in greater detail with reference to the following examples, but the present invention should not be construed as being limited thereto.

<<Manufacture of Lithographic Printing Plate Precursor>>

<Preparation of Substrate>

A 0.3 mm-thick aluminum plate (JIS 1050) was degreased by washing with trichloroethylene and the surface thereof was grained using a nylon brush and an aqueous suspension of 400-mesh pumice stone and then thoroughly washed with water. The plate was etched by immersing it in an aqueous 25% sodium hydroxide solution at 45° C. for 9 seconds, washed with water, immersed in 20% nitric acid for 20 seconds and then washed with water. The etched amount of the grained surface was about 3 g/$m^2$. Thereafter, the plate was anodized in 7% sulfuric acid as the electrolyte by passing a direct current at a current density of 15 A/$dm^2$ to provide an anodic oxide film in an amount of 3 g/$m^2$. The plate was then washed with water, dried and further treated with an aqueous 2.5 wt % sodium silicate solution at 30° C. for 10 seconds. The following undercoat solution was coated on the plate and the coating film was dried at 80° C. for 15 seconds to obtain a substrate. The dry coverage of the coating film was 15 mg/$m^2$.

| <Undercoat Solution> | |
|---|---|
| Polymer compound shown below | 0.3 g |
| Methanol | 100 g |
| Water | 1 g |

-continued

| <Undercoat Solution> |
|---|
| 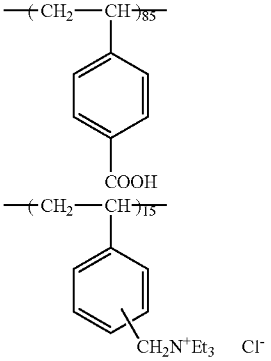 |

Molecular weight: 28,000

<Formation of Recording Layer 1>

On the substrate, the following coating solution for lower layer was coated to give a coated amount of 0.85 g/$m^2$ and then dried at 140° C. for 50 seconds using PERFECT OVEN PH200 manufactured by Tabai Corp. by setting to Wind Control 7. Thereafter, the following coating solution for heat-sensitive layer was coated to give a coated amount of 0.15 g/$m^2$ and then dried at 120° C. for 1 minute to obtain Lithographic Printing Plate Precursors 1 to 10.

| <Coating Solution for Lower Layer> | |
|---|---|
| N-(4-Aminosulfonylphenyl)methacrylamide/acrylonitrile/methyl methacrylate (36/34/30, weight average molecular weight: 50,000) | 2.133 g |
| 3-Methoxy-4-diazodiphenylamine hexafluorophosphate | 0.030 g |
| Cyanine Dye A (having a structure shown below) | 0.109 g |
| 4,4'-Bishydroxyphenylsulfone | 0.063 g |
| Tetrahydrophthalic anhydride | 0.190 g |
| p-Toluenesulfonic acid | 0.008 g |
| Compound obtained by replacing counter ion of Ethyl Violet with 6-hydroxynaphthalenesulfonate | 0.05 g |
| Fluorine-containing surfactant (Megafac F-176, produced by Dai-Nippon Ink & Chemicals, Inc.) | 0.035 g |
| Methyl ethyl ketone | 26.6 g |
| 1-Methoxy-2-propanol | 13.6 g |
| γ-Butyrolactone | 13.8 g |

Cyanine Dye A

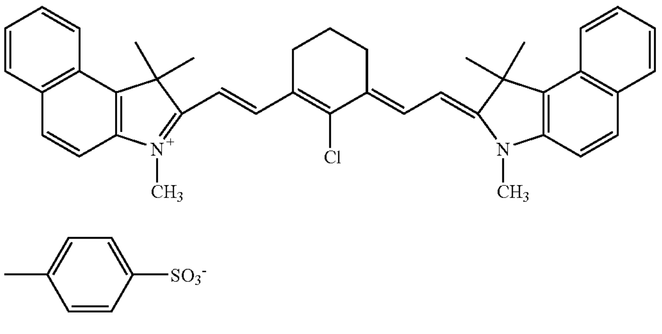

-continued

| <Coating Solution for Heat-Sensitive Layer> | |
|---|---|
| m,p-Cresol novolak (m/p ratio: 6/4, weight average molecular weight: 4,500, containing 0.8 wt % of unreacted cresol) | 0.237 g |
| Cyanine Dye A (having a structure shown above) | 0.047 g |
| Dodecyl stearate | 0.060 g |
| 3-Methoxy-4-diazodiphenylamine hexafluorophosphate | 0.030 g |
| Fluorine-containing surfactant (Megafac F-176, produced by Dai-Nippon Ink & Chemicals, Inc.) | 0.110 g |
| Fluorine-containing surfactant (Megafac MCF-312 (30%, produced by Dai-Nippon Ink & Chemicals, Inc.) | 0.120 g |
| Methyl ethyl ketone | 15.1 g |
| 1-Methoxy-2-propanol | 7.7 g |
| Inhibitor shown in Table 1 below | X g |
| <Formation of Recording Layer 2> | |

On the same substrate as described above, the following coating solution for recording layer 2 was coated to give a coated amount of 1.0 g/$m^2$ and then dried at 140° C. for 50 seconds to obtain Lithographic Printing Plate Precursors 11 and 12 each having a single recording layer.

| <Coating Solution for Heat-Sensitive Layer> | |
|---|---|
| N-(4-Aminosulfonylphenyl)methacrylamide/acrylonitrile/methyl methacrylate (35/35/30, weight average molecular weight: 50,000) | 1.896 g |
| Cresol novolak (m/p = 6/4, weight average molecular weight: 4,500, residual monomer: 0.8 wt %) | 0.332 g |
| Cyanine Dye A (having a structure shown above) | 0.155 g |
| 4,4'-Bishydroxyphenylsulfone | 0.063 g |
| Tetrahydrophthalic anhydride | 0.190 g |
| p-Toluenesulfonic acid | 0.008 g |
| Compound obtained by replacing counter ion of Ethyl Violet with 6-hydroxynaphthalenesulfonate | 0.05 g |
| Fluorine-containing surfactant (Megafac F-176, produced by Dai-Nippon Ink & Chemicals, Inc.) | 0.145 g |
| Fluorine-containing surfactant (Megafac MCF-312 (30%, produced by Dai-Nippon Ink & Chemicals, Inc.) | 0.120 g |
| Methyl ethyl ketone | 26.6 g |
| 1-Methoxy-2-propanol | 13.6 g |
| γ-Butyrolactone | 13.8 g |
| Inhibitor shown in Table 1 below | X g |

<<Evaluation of Lithographic Printing Plate Precursor>>

With each of the lithographic printing plate precursors obtained, scratch resistance with an exhausted developer and sensitivity were evaluated. The exhausted developer was prepared in the following manner. Specifically, 50 sheets (each having a size of 1030×800 mm) of Lithographic Printing Plate Precursor 1 were subjected to exposure at an image area rate of 20% using Trendsetter manufactured by Creo Co. under conditions of beam power of 9 W and a drum revolution number of 150 rpm. Then, 50 sheets of the exposed lithographic printing plate precursors were developed using PS Processor 940H manufactured by Fuji Photo Film Co., Ltd. equipped with a first bath containing a developer prepared by diluting developer stock solution shown below so as to obtain sensitivity of 95 mJ/$cm^2$, a second bath containing water and a third bath containing Finisher FP-2W manufactured by Fuji Photo Film Co., Ltd. at a developer temperature of 30° C. and a developing time of 12 seconds, while replenishing the developer stock solution so as to maintain the sensitivity regularly.

| Developer Stock Solution | |
|---|---|
| Potassium hydroxide (48 wt % aqueous solution) | 75 g |
| Sorbitol (65 wt % aqueous solution) | 100 g |
| Sorbitol-ethylene oxide adduct (30 units of ethylene oxide) | 1.0 g |
| Dispersing agent (DQ-2066) | 0.50 g |
| Monosodium diphenylether-4,4'-disulfonate | 1.0 g |
| Water | 1,000 g |

<Evaluation of Scratch Resistance with Exhausted Developer>

The lithographic printing plate was scratched by rubbing it with a glove and then developed with the exhausted developer described above. The degree of film loss was visually observed.

The scratch resistance was evaluated according to the following criteria and the evaluation results are shown in Table 1 below.

| | |
|---|---|
| ⊚: | Trace of scratch could not be recognized. |
| ○: | Trace of scratch was slightly recognized. |
| Δ: | Trace of scratch was fairly recognized. |
| X: | Trace of scratch was developed. |

<Evaluation of Sensitivity>

The lithographic printing plate precursor was subjected to an imagewise drawing of a test pattern using Trendsetter manufactured by Creo Co. while varying the exposure energy and then developed with a developer prepared by diluting a developer DT-1 produced by Fuji Photo Film Co., Ltd. so as to have an electrical conductivity of 45 mS/cm. The exposure energy capable of developing the non-image area with the developer was measured and the energy value was defined as the sensitivity. As the numerical value is smaller, the sensitivity is evaluated higher. The results are shown in Table 1.

TABLE 1

Effect of Addition of Inhibitor

| Printing Plate Precursor | Recording Layer | Inhibitor | Amount Added (g) | Scratch Resistance with Exhausted Developer | Sensitivity (mJ/cm) |
|---|---|---|---|---|---|
| 1 | 1 | Tetrabutylammonium bromide | 0.020 | ◎ | 90 |
| 2 | 1 | Tetraoctylammonium bromide | 0.025 | ○ | 100 |
| 3 | 1 | Tetraphenyl-ammonium bromide | 0.030 | ○ | 95 |
| 4 | 1 | Distearyldimethyl-ammonium bromide | 0.050 | ○ | 105 |
| 5 | 1 | Trioctylmethyl-ammonium bromide | 0.040 | ○ | 110 |
| 6 | 1 | Benzyltrimethyl-ammonium bromide | 0.060 | ○ | 105 |
| 7 | 1 | Polyethylene glycol 4000 | 0.040 | ○ | 105 |
| 8 | 1 | 2,2-Dihydroxy-4,4-dihexoxybenzo-phenone | 0.050 | ○ | 110 |
| 9 | 1 | Methyl para-toluenesulfonate | 0.035 | ○ | 105 |
| 10 | 1 | Not added | | ΔX | 95 |
| 11 | 2 | Tetrabutylammonium bromide | 0.050 | Δ | 120 |
| 12 | 2 | Not added | | ΔX | 95 |

It is seen from the results shown in Table 1 that the lithographic printing plate precursor of the present invention is excellent in the scratch resistance with an exhausted developer and has good sensitivity.

On the contrary, the lithographic printing plate precursor where the recording layer does not contain an inhibitor exhibits poor scratch resistance, and the lithographic printing plate precursor where the recording layer has a single layer structure has low sensitivity.

The lithographic printing plate precursor of the present invention has a positive working recording layer comprising an alkali-soluble lower layer and an upper layer which contains an infrared absorbent, an alkali-soluble resin and an inhibitor of inhibiting the alkali-soluble resin from dissolving in an alkali aqueous developer and increases in solubility in the alkaline aqueous solution upon irradiation of infrared light. The lithographic printing plate precursor is developed with an alkali developer not containing a silicate and mainly comprising an organic compound having a buffering activity and a base whereby both good scratch resistance and high sensitivity can be attained even when an exhausted developer is used.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A lithographic printing plate precursor comprising a hydrophilic support, an alkali-soluble layer and provided on the alkali-soluble layer a recording layer which contains an infrared ray absorbent, an alkali-soluble resin and an inhibitor for inhibiting the alkali-soluble resin from dissolving in an alkali aqueous developer and increases in the solubility in an alkaline aqueous solution upon irradiation of infrared light, wherein said inhibitor is a quaternary ammonium salt compound.

2. The lithographic printing plate precursor as claimed in claim 1, wherein the alkali-soluble layer comprises an alkali-soluble polymer of acrylic resin having a sulfonamido group.

* * * * *